US012777886B2

(12) United States Patent
Smith et al.

(10) Patent No.: US 12,777,886 B2
(45) Date of Patent: Oct. 27, 2026

(54) SUBSTRATE CONTAINER, AND DOOR LOCKING MECHANISM THEREOF

(71) Applicant: ENTEGRIS, INC., Billerica, MA (US)

(72) Inventors: Mark V. Smith, Colorado Springs, CO (US); Shawn D. Eggum, Lonsdale, MN (US)

(73) Assignee: Entegris, Inc., Billerica, MA (US)

(*) Notice: Subject to any disclaimer, the term of this patent is extended or adjusted under 35 U.S.C. 154(b) by 0 days.

(21) Appl. No.: 18/732,521

(22) Filed: Jun. 3, 2024

(65) Prior Publication Data

US 2024/0412994 A1 Dec. 12, 2024

Related U.S. Application Data

(60) Provisional application No. 63/471,376, filed on Jun. 6, 2023.

(51) Int. Cl.
*H10P 72/10* (2026.01)

(52) U.S. Cl.
CPC ................................ *H10P 72/1914* (2026.01)

(58) Field of Classification Search
CPC ........... H01L 21/67373; H01L 21/6735; E05B 73/0023; B65D 45/16; H05K 13/021; H10P 72/1914
USPC .......... 206/710, 711, 1.5, 832; 220/315, 324
See application file for complete search history.

(56) References Cited

U.S. PATENT DOCUMENTS

| | | | | |
|---|---|---|---|---|
| 7,377,736 | B1 | 5/2008 | Fujii et al. | |
| 11,948,820 | B1 * | 4/2024 | Chiu | H01L 21/67386 |
| 2002/0106266 | A1 * | 8/2002 | Bonora | H10P 72/1914 414/217 |
| 2003/0141217 | A1 | 7/2003 | Park | |
| 2004/0040884 | A1 * | 3/2004 | Pai | H10P 72/1914 206/710 |
| 2007/0215516 | A1 | 9/2007 | Sumi | |
| 2007/0297884 | A1 * | 12/2007 | Jung | H01L 21/67373 414/411 |
| 2009/0026109 | A1 * | 1/2009 | Hasegawa | H10P 72/1914 206/711 |
| 2010/0032339 | A1 * | 2/2010 | Hasegawa | B65D 55/14 206/710 |

(Continued)

FOREIGN PATENT DOCUMENTS

| | | | |
|---|---|---|---|
| JP | 2018531509 | A | 10/2018 |
| KR | 20050045695 | A | 5/2005 |

(Continued)

*Primary Examiner* — Rafael A Ortiz

(57) ABSTRACT

A substrate container includes a shell and a door for an opening of the shell. The shell includes one or more first latch sockets and one or more second latch sockets. The door includes a first locking mechanism that includes a first latch with first latch tip insertable into the one or more first latch sockets and a second latch with a second latch tip extendable into the second latch sockets. A width of the one or more first latch sockets blocks the second latch tip from being inserted into the one or more first latch sockets. A door for a substrate container includes a door housing and a first locking mechanism disposed in the door housing. A method of closing a substrate container includes inserting a door into an opening of the substrate container and adjusting a first locking mechanism of the door.

20 Claims, 10 Drawing Sheets

(56) References Cited

U.S. PATENT DOCUMENTS

| | | | | |
|---|---|---|---|---|
| 2011/0174389 | A1* | 7/2011 | Chiu | F16J 15/46 137/223 |
| 2017/0236737 | A1 | 8/2017 | Gregerson et al. | |
| 2018/0068882 | A1* | 3/2018 | Kato | H01L 21/67373 |
| 2019/0295875 | A1 | 9/2019 | Smith et al. | |
| 2023/0238265 | A1* | 7/2023 | Kubota | H01L 21/67373 414/217 |
| 2023/0386876 | A1* | 11/2023 | Chiu | E05B 65/523 |

FOREIGN PATENT DOCUMENTS

| | | | |
|---|---|---|---|
| TW | M528296 | U | 9/2016 |
| TW | M534165 | U | 12/2016 |
| TW | M641871 | U | 6/2023 |

* cited by examiner

SUBSTRATE CONTAINER, AND DOOR LOCKING MECHANISM THEREOF

FIELD

This disclosure relates to substrate containers. More specifically, this disclosure relates to door locking mechanisms in substrate containers.

BACKGROUND

A semiconductor device can be manufactured from a wafer substrate. The wafer substrate, or simply wafer, undergoes a series of fabrication steps. For example, fabrication steps can include, but are not limited to, material layer deposition, doping, etching, or chemically or physically reacting material(s) of the substrate. One or more wafers can be stored and transported in a substrate container, such as a front opening unified pod ("FOUP"), before, during, or after fabrication. The substrate container can include a door that is removable for accessing the interior of the substrate container. For example, the door can be removed (e.g., opened) to allow for placing one or more wafers into the container and/or for removing one or more of the wafers from the container. In some processes, the door may be removed to access the wafers and apply a fabrication step to each of the wafer substrate individually.

SUMMARY

In an embodiment, a substrate container includes a shell and a door. The shell defines an interior space and has an opening defined by a door frame. The door frame includes one or more first latch sockets and one or more second latch sockets disposed on opposite sides of the door frame. The door includes a first locking mechanism. The door configured to be inserted in the opening of the shell and attached to the door frame by the first locking mechanism. The first locking mechanism includes a first latch and a second latch. The first latch includes a first latch tip rotatable to extend through a first side of the door. The second latch includes a second latch tip rotatable to extend through a second side of the door. The first latch tip has a width insertable into both the one or more first latch sockets and the one or more second latch sockets. The second latch tip has a width insertable into the one or more second latch sockets. The one or more first latch sockets have a first width that blocks the second latch tip from being inserted into the one or more first latch sockets.

In an embodiment, a door for a substrate container includes a door housing including a first side and a second side and a locking mechanism disposed in the door housing. The locking mechanism is configured to attach the door in an opening of a shell of the substrate container via one or more first latch sockets and one or more second latch sockets disposed on opposite sides of a door frame of the shell. The first locking mechanism includes a first latch and a second latch. The first latch includes a first latch tip that is configured to rotate to extend through the first side of the door housing. The second latch includes a second latch tip that is configured to rotate to extend through the second side of the door housing. The first latch tip has a width configured to be inserted into the one or more first latch openings. The second latch tip has a width insertable into the one or more second latch sockets. The first latch sockets including a width that blocks the second latch tip from being inserted into the one or more first latch sockets.

In an embodiment, a method is directed to closing a substrate container. The method includes inserting a door into an opening of the substrate container. The substrate container includes a shell defining an interior space. The shell includes the opening defined by a door frame that includes one or more first latch sockets and one or more second latch sockets. The door includes a first locking mechanism with a first latch and a second latch. The method also includes adjusting the first locking mechanism from an unlocked position to a locked position. The adjusting includes rotating a first latch tip of the first latch to extend through a first side of the door and rotating a second latch tip of the second latch to extend through a second side of the door. In a first orientation of the door in the opening, the adjusting is configured to insert the first latch tip into the one or more first latch sockets and insert the second latch tip into the one or more second latch sockets. In a second orientation of the door in the opening, the adjusting is configured to have a first width of the one or more first latch sockets block the second latch tip from being inserted into the one or more first latch sockets, which blocks the first locking mechanism from achieving the locked position.

DRAWINGS

Like numbers represent like features.

DETAILED DESCRIPTION

Substrates in the form of wafers can be processed to form semiconductor devices. A substrate container is a container for carrying the substrates during processing. The substrates can be stored within a substrate container before and during the different process steps. The substrate container is accessed through an opening of the substrate container. The substrate container may be, for example, a front opening unified pod (FOUP).

The substrate container can include a door that is inserted into the opening. The door can be configured to inserted into the opening in multiple orientations. For example, the shape of the door allows for the door to be insertable in multiple orientations can also provide the door with improved sealing of the opening. Embodiments described herein can provide the door with a locking mechanism that does not lock when the door is not in the desired orientation. For example, the locking mechanism not being able to lock can indicate to a user and/or automated attachment that the door is inserted in an incorrect orientation.

Figure 1:
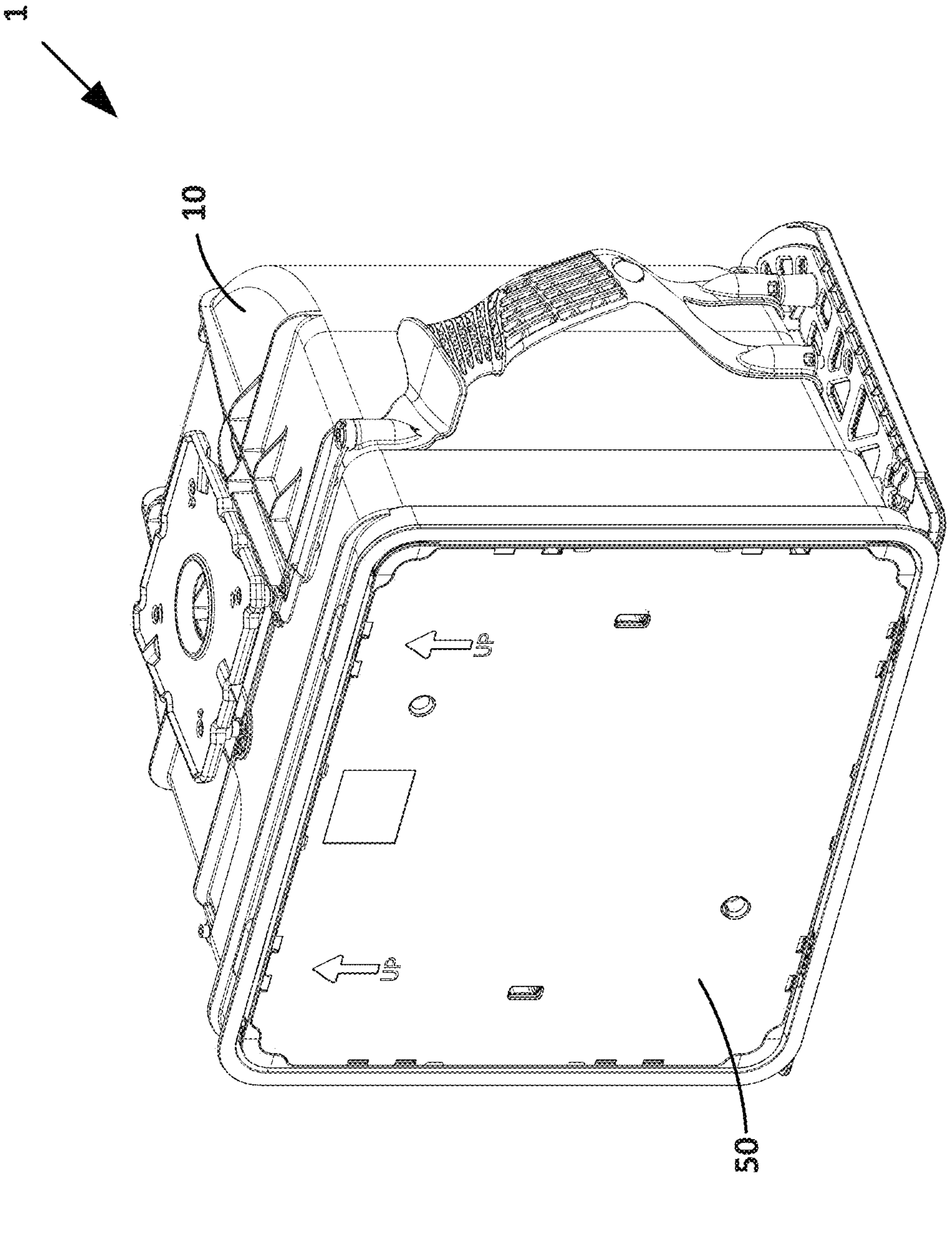
FIG. 1 is a front perspective view of an embodiment of a substrate container.
Figure 2:
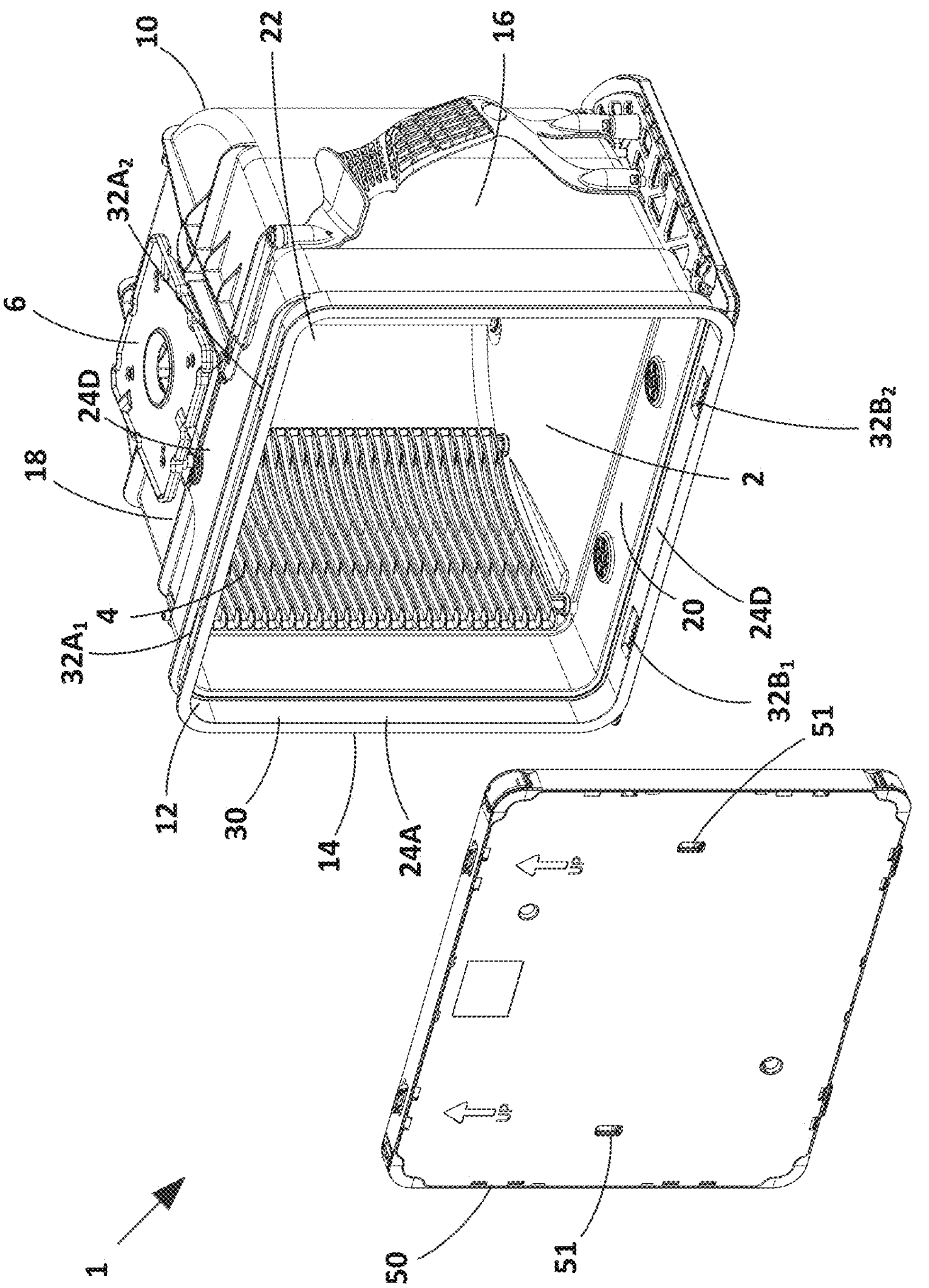
FIG. 2 is a prospective view of the substrate container in FIG. 1 when open, according to an embodiment.

FIGS. 1 and 2 show an embodiment of a substrate container 1. The substrate container 1 includes a shell 10 and a door 50. FIG. 1 is a front perspective view of the substrate container 1 with the door 50 inserted (e.g., closed). FIG. 2 is a prospective view of the substrate container with the door 50 removed (e.g., opened). The shell 10 includes an opening 12 (shown in FIG. 2). As shown in FIG. 1, the door 50 is received within the opening 12 of the shell 10, blocking the opening 12.

FIG. 2 illustrates the substrate container 1 with the door 50 removed (e.g., opened). As shown in FIG. 2, the substrate container 1 includes an interior space 2, in which substrates (not shown) are stored. The interior space 2 of the substrate container is defined by the shell 10. The door 50 is received in the shell 10 by inserting the door 50 into the opening 12 in the shell 10. As shown in the illustrated embodiment, the substrate container 1 can be a front opening unified pod ("FOUP"). For example, the opening 12 can be a front opening in the shell 10 and the door 50 can be a front door of the substrate container 1.

The door 50 includes one or more locking mechanisms 60A, 60B (e.g., shown in FIG. 4A) configured to attach the door 50 to the shell 10. For example, the one or more locking mechanisms 60A, 60B are configured to prevent accidental removal of the door 50 from the shell 10. The substrate container 1 can be opened by unlocking of the one or more locking mechanism(s) 60A, 60B of the door 50 and then moving (e.g., opening, removing) the door 50 from the opening 12. The door is shown in FIG. 2 with the locking mechanisms 60A, 60B in a locked position for illustrative purposes. It should be appreciated that the door 50 would be in the unlocked position to be removed from the shell 10. The door 50 can include one or more key holes 51 that allow for operating the locking mechanism(s) 60. For example, a load port key (not shown) can be inserted into each key hole 51 and then turned to unlock the locking mechanisms 60A, 60B. The one or more locking mechanisms 60A, 60B are discussed in more detail below.

As further shown in FIG. 2, the shell 10 includes a first side wall 14, a second side wall 16, a top wall 18, and a bottom wall 20, and a rear wall 22. The first side wall 14 is opposite to the second side wall 16, and the top wall 18 is opposite the bottom wall 20. The first side wall 14 can be referred to as the left side while the second side wall 16 can be referred to as the right side. The top wall 18 and bottom wall 20 each extend between the first side wall 14 and the second side wall 16.

The substrate container 1 can include an equipment hookup 6 on the top wall 18 of the shell 10. In an embodiment, the equipment hookup 6 allows a standard automated attachment (not shown) for moving the substrate container 1, such as but not limited to an automated arm, to be connected to the substrate container 1. For example, the automated arm may be used to move the substrate container 1 between different processing equipment. In an embodiment, the substrate container 1 may include one or more handles to allow a user (e.g., a technician, etc.) to manually move the substrate container 1.

The substrate container 1 can include a plurality of shelves 4 for holding substrates (not shown) in the interior space 2. The portions of the shelves 4 on the second side wall 16 are obscured in FIG. 2, which have a similar configuration to the portions on the shelves 4 on the first side wall 14 (e.g., slots in the substrate container 1). The shelves 4 are sized to each hold a substrate (not shown) within the interior space 2. For example, the shelves 4 in an embodiment are sized to hold a specific size of substrate (e.g., 150 mm wafers, 200 mm wafers, etc.).

The shell 10 includes a door frame 30 that defines the opening 12 in the shell 10. The door frame 30 is formed by the first side wall 14, the second side wall 16, the top wall 18, and the bottom wall 20 of the shell 10. For example, the first side wall 14, the second side wall 16, the top wall 18, and the bottom wall 20 each have an end portion 28A, 28B, 28C, 28D (e.g., each have a front portion) that is adjacent to opening 12 in the shell 10. The end portions 28A, 28B, 28C, 28D of the walls 14, 16, 18, 20 form the door frame 30.

The door frame 30 includes one or more first latch sockets $32A_1$, $32A_2$ (e.g., shown in FIG. 4A) and one or more second latch sockets $32B_1$, $32B_2$. A socket refers to an opening formed in the shell 10 that is configured to receive a latch tip from the door 50 and prevents removal of the door 50 from the shell 10 while the latch tip is disposed in said opening. For example, the opening may be in the form of, but is not limited to, a slot, a pocket, or the like formed in the shell 10. The first latch socket(s) $32A_1$, $32A_2$ are disposed on an opposite side of the door frame 30 to the second latch socket(s) $32A_1$, $32A_2$. In the illustrated embodiment, the door frame 30 includes first latch sockets $32A_1$, $32A_2$ (e.g., shown in FIG. 4A) and second latch sockets $32B_1$, $32B_2$. As shown in FIG. 1, the first latch sockets $32A_1$, $32A_2$ and the second latch sockets $32B_1$, $32B_2$ are located on opposing sides of the door frame 30. For example, the first latch sockets $32A_1$, $32A_2$ are located on the top wall 18 and the second latch sockets $32B_1$, $32B_2$ are located in the bottom wall 20. The first latch sockets $32A_1$, $32A_2$ and the second latch sockets $32B_1$, $32B_2$ are disposed along a parameter edge of the door frame 30 (e.g., located on edges that extend to the opening 12).

The locking mechanisms 60A, 60B, when in the locked position, are engaged with the first latch sockets $32A_1$, $32A_2$ and the second latch sockets $32B_1$, $32B_2$ to prevent removal of the door 50 from the opening 12 in the shell 10. The first locking mechanism 60A in the locked position is engaged with a first one of the first latch sockets $32A_1$ and a first one of the first latch sockets $32A_1$. The second locking mechanism 60B in the locked position is engaged with a second one of the first latch sockets $32A_2$ and a second one of the second latch sockets $32B_2$.

Figure 3:
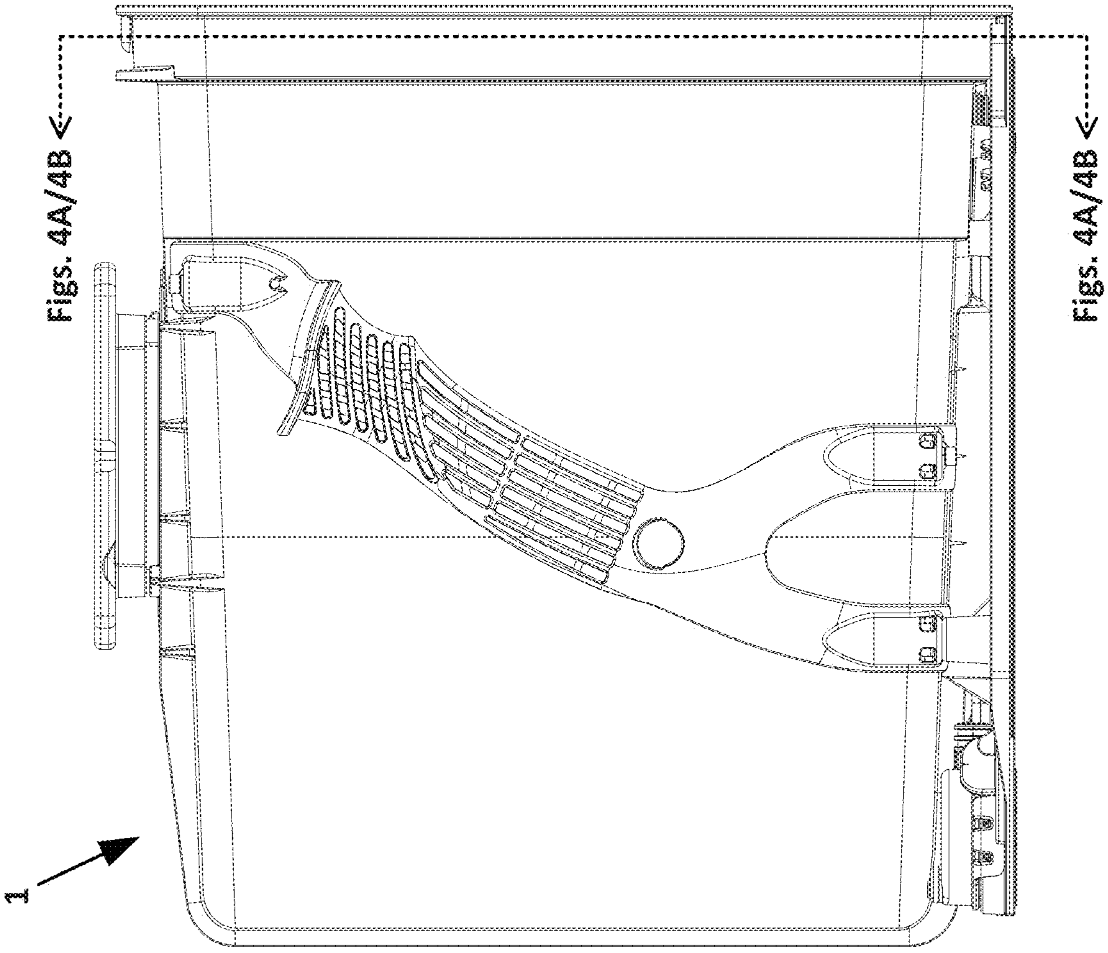
FIG. 3 is a side view of the substrate container in FIG. 1, according to an embodiment.
Figure 4A:
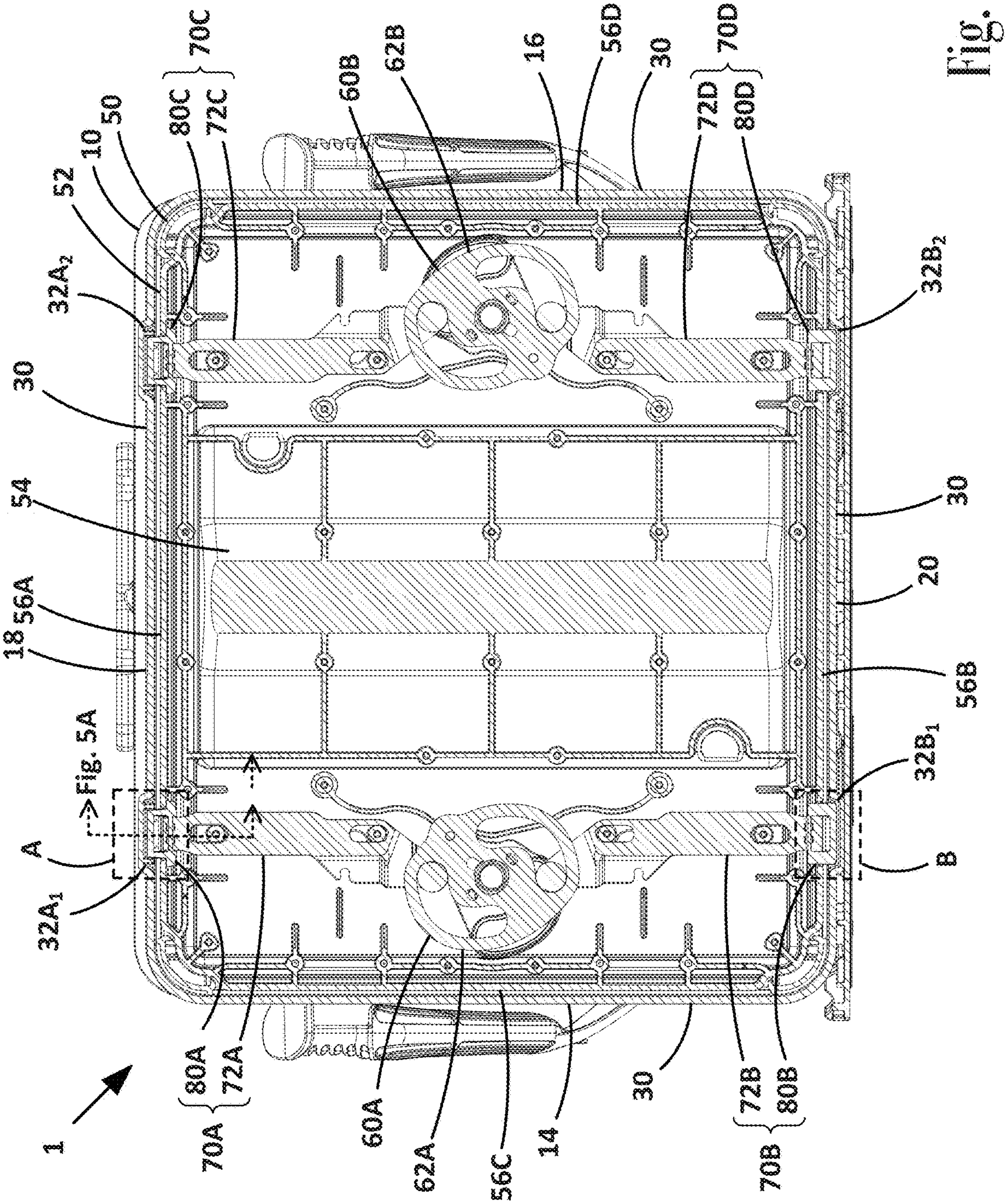
FIG. 4A is a cross-sectional view of the substrate container in FIG. 3 when locked, according to an embodiment.
Figure 4B:
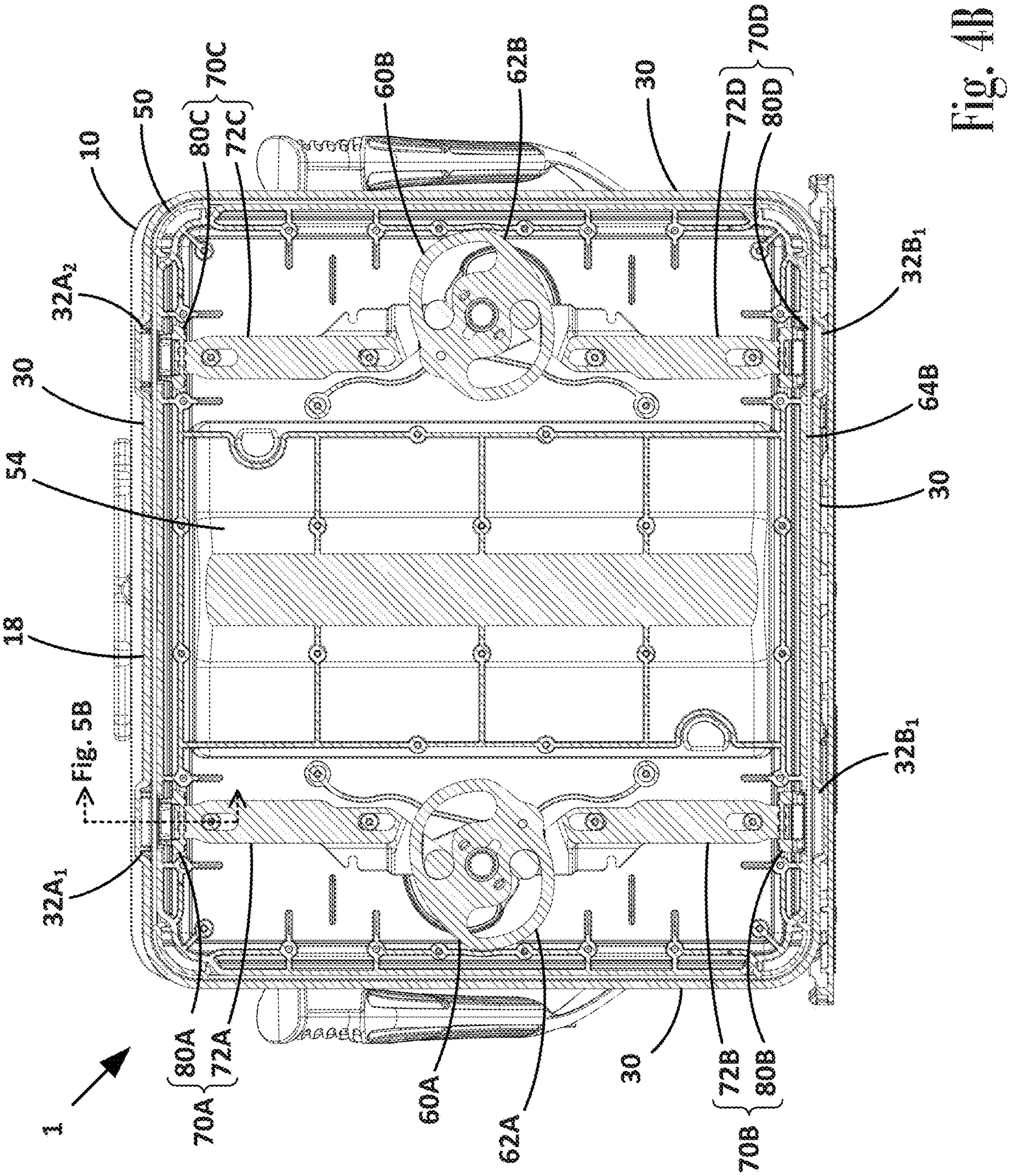
FIG. 4B is the cross-sectional view of the substrate container in FIG. 3 when unlocked, according to an embodiment.

FIG. 3 is a side view of the substrate container 1 in FIG. 1, according to an embodiment. FIGS. 4A and 4B are each a cross-sectional view of the substrate container 1, according to an embodiment. The cross-sectional view in both of FIGS. 4A and 4B is along the line indicated in FIG. 3. FIG. 4A shows the first locking mechanism 60A of the door 50 in a locked position. FIG. 4B shows the first locking mechanism 60A of the door 50 in the unlocked position.

The door 50 includes a door housing 52 that defines an internal space 54 of the door 50. FIG. 4 shows the internal space 54 of the door 50. The door housing 10 separates the internal space 54 of the door 50 from the internal space 2 of the shell 10 in which the wafers are stored. The locking mechanisms 60A, 60B are disposed within the door housing 52 in the internal space 54 of the door 50. Each locking mechanism 60A, 60B is configured to be moved between the locked position and the unlocked position. The door 50 (e.g., in FIGS. 1 and 4A) is configured to seal the opening 12 of substrate container 1. For example, the seal between the door 50 and the shell 10 is configured to prevent entry of containments (e.g., dust, moisture, air, or the like) into the internal space 2 through the opening 12.

The door 50 includes a first side 56A, a second side 56B, a third side 56C, and a fourth side 56D. As shown in FIG. 4A, the sides 56A, 56B, 56C, 56D can each be a sidewall of the door housing 52 of the door 50. As shown in FIG. 4, the first side 56A and the second side 56B are opposite sides of the door 50. For example, the first side 56A, the second side 56B, the third side 56C, and the fourth side 56D can each be a sidewall of the door housing 52 of the door 50. As shown in FIG. 4, in the locked position, the first side 56A of the door 50 faces the top wall 18 of the shell 10 and the second side 56B of the door 6 faces the bottom wall 18 of the shell 10. In the locked positon, the third side 56C of the door 50 faces the first side wall 14 of the shell 10, and the fourth side 56D of the door 50 faces the second side wall 16 of the shell 10.

In the illustrated embodiment, the door 50 includes a first locking mechanism 60A and a second locking mechanism 60B. It should be appreciated that the door 50 of the substrate container 1 in an embodiment may include a different number of locking mechanisms than two. For example, the door 50 in an embodiment may include a one locking mechanism, three locking mechanisms, or more than three locking mechanisms. In an embodiment, the door 50 may include a single locking mechanism 60A. In such an embodiment, the door frame 30 may include a single first latch socket $\mathbf{34}A_1$ and a single second latch socket $\mathbf{34}B_1$ for the single locking mechanism 60A.

As shown in FIG. 4A, the first locking mechanism 60A includes a first latch 70A and a second latch 70B. The first latch 70A includes a first latch tip 80A. The second latch 70B includes a second latch tip 80B. The first locking mechanism 60A is configured move between the unlocked position (shown in FIG. 4B) and the locked position (shown in FIG. 4A).

In the illustrated embodiment, the first locking mechanism 60A includes a rotatable cam 62A that is rotatable to move the first locking mechanism 60A between the locked position and the unlocked position. For example, the rotatable cam 62A can be rotated by a load port key (not shown) via the respective key hole 51 (shown in FIGS. 1 and 2) formed in the door housing 52. The rotatable cam 62A is coupled to both the first latch 70A and the second latch 70B. For example, the rotatable cam 62A can be separately coupled to each of the first latch 70A and the second latch 80B. The rotatable cam 62A is configured to be operated and rotated using an external tool (e.g., by a user, by an automated attachment, etc.). The rotatable cam 62A is rotatable within the door 50 (e.g., rotatable relative to the door housing 52). The rotatable cam 62A is configured so that the rotation of the rotatable cam 62A causes rotation of the first latch tip 80A of the first latch 70A and rotation of the second latch tip 80B of the second latch 70B.

The first latch 70A includes a first arm 72A that couples the rotatable cam 62A to the first latch tip 80A such that the rotation of the rotatable cam 62A causes the rotation of the first latch tip 80A. The second latch 70B includes a second arm 72B that couples the rotatable cam 62A to the second latch tip 80B such that the rotation of the rotatable cam 62A causes the rotation of the second latch tip 80B. For example, each arm 72A, 72B is coupled to the rotatable cam 62A and to its respective latch tip 80A, 80B such that the rotation of the rotatable cam 62A moves each arm 72A, 72B in a linear direction (e.g., relative to the door housing 52), and the linear movement of each arm 72A, 72B moves its respective latch tip 80A, 80B to rotate and extend out of the door housing 52. The rotation of the latch tips 80A, 80B is discussed in more detail below.

Locking of the first locking mechanism 60A (e.g., moving the locking mechanism from the unlocked position in FIG. 4B to the locked position in FIG. 4A) rotates the first latch tip 80A to extend through the first side 56A of the door 50 and rotates the second latch tip 80B to extend through the second side 56B of the door 50. The first latch tip 80A is rotated to extend through the first side 56A into the first latch socket $\mathbf{32}A_1$ in the shell 10, and the second latch tip 80B is rotated to extend through the second side 56B into the second latch socket $\mathbf{32}B_1$ in the shell 10. As shown in FIG. 4A, in the locked position, the first latch tip 80A is disposed in the first latch socket $\mathbf{32}A_1$ of the shell 10 and the second latch tip 80B is disposed in the second latch socket $\mathbf{32}B_1$ of the shell 10.

Unlocking of the first locking mechanism 60A (e.g., moving the locking mechanism from the locked position in FIG. 4A to the unlocked position in FIG. 4B) rotates the first latch tip 80A to retract through the first side 56A of the door 50 and rotates the second latch tip 80B to extend through the second side 56B of the door 50. The first latch tip 80A is retracted through the first side 56A and within the door housing 52. The second latch tip 80B is retracted through the second side 56B and within the door housing 52. As shown in FIG. 4B, in the unlocked position, the first latch tip 80A is disposed in the internal space 54 of the door 50 and the second latch tip 80B is disposed in the internal space 54 of the door 50.

When present, the second locking mechanism 60B can have a similar configuration to the first locking mechanism 60A. For example, the second locking mechanism 60B may include a second rotatable cam 62B, a third latch 80C with a third latch arm 72C and a third latch tip 80C, and a fourth latch 80C with a fourth latch arm 72D and a fourth latch tip 80D, similar to the first locking mechanism 60A. For example, the third latch tip 80C in the door 50 rotates to extend through the first side 56A of the door 50 (e.g., to be disposed in a second one of the first latch sockets $\mathbf{32}A_2$) and the fourth latch tip 80D in the door 50 rotates to extend through the second side 56B of the door 50 (e.g., to be disposed in a second one of the second latch sockets $\mathbf{32}B_2$), in a similar manner to the first and second latch tips 80A, 80B of the first locking mechanism 80A.

Figure 5A:
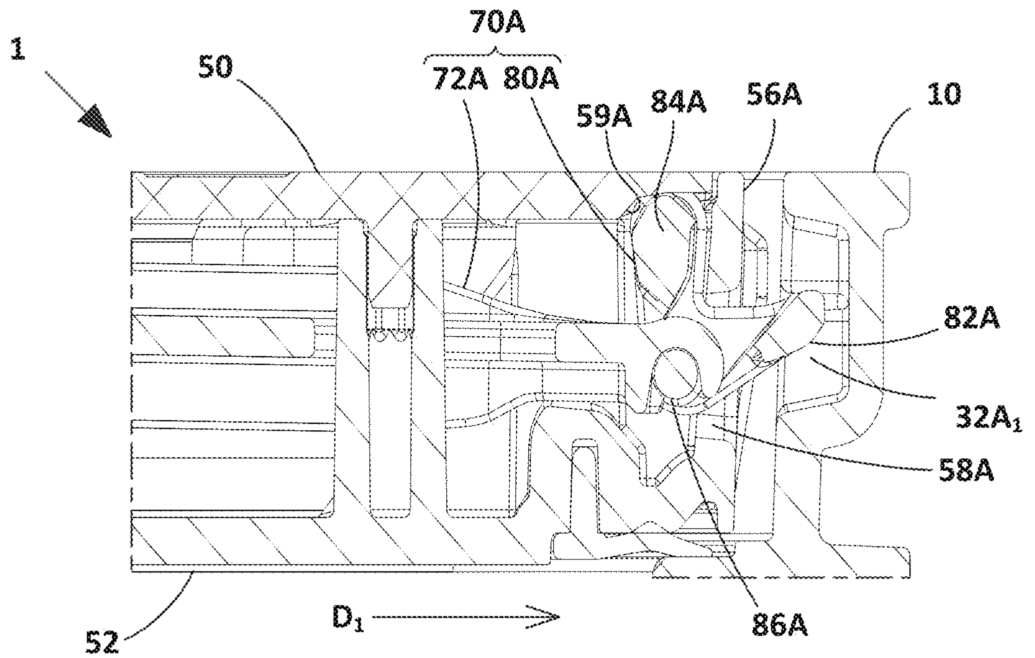
FIG. 5A is a partial cross-sectional view of the substrate container in FIG. 4A, according to an embodiment.
Figure 5B:
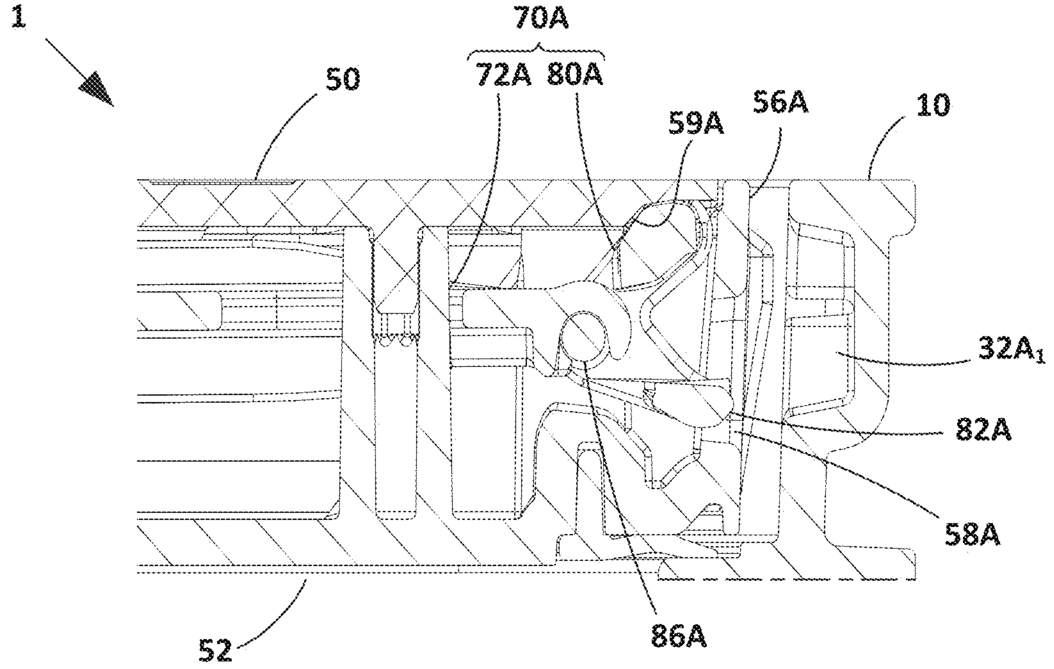
FIG. 5B is a partial cross-sectional view of the substrate container in FIG. 4B, according to an embodiment.

FIGS. 5A and 5B are a cross sectional views of the first latch 70A, according to an embodiment. The cross-sectional view in FIG. 5A is indicated in FIG. 4A. The cross-sectional view in FIG. 5B is indicated in FIG. 4B. FIG. 5A shows the first latch tip 80A when the first locking mechanism 60A of the door 50 is in the locked position. FIG. 5B shows the first latch tip 80A when the first locking mechanism 60A of the door 50 is in the unlocked position.

The first latch tip 80A includes an engagement member 82A and a pivot member 84A. The engagement member 82A and the pivot member 84A extend in different directions (e.g., each have a length that extends in different direction than the length of the other member). The door 50 includes an opening 58A for the first latch tip 80A. As shown in FIGS. 5A and 5B, the opening 58A is in the first side 56A of the door housing 52. The rotation of the first latch tip 80A moves the engagement member 82A to extend through the opening 58A in the first side 56A of the door 50. In the locked position, the engagement member 82A is disposed in the first latch socket 32$A_1$ of the shell 10.

As discussed above, the first arm 72A is configured to move linearly in and along a first direction $D_1$). The first latch tip 80A is rotatably coupled to the first arm 72A. For example, the first arm 72A can be rotationally coupled to a shaft 86A of the first latch tip 80A. The engagement member 82A and the pivot member 84A of the first latch tip 80A each extend in different directions from the shaft 86A of the first latch tip 80A. The movement of the first arm 72A also moves the first latch tip 80A in the first direction $D_1$ (e.g., the first latch tip 80A is coupled to the first arm 72A such that the first latch tip 80A moves along with the first arm 72A).

The movement of the first latch tip 80A pushes the pivot member 84A against an inner surface 59A of the door 50 (e.g., an inner surface 59A of the first side 56A of the housing 52) which causes the rotation of the first latch tip 80A. The contact of the pivot member 84A against the inner surface 59A causes the movement of the first latch tip 80A in direction $D_1$ to also cause the rotation of the first latch tip 80A. The first latch tip 80A rotates relative to the first arm 72A and the housing 52.

The second arm 72B and second latch tip 80B of the second latch 70B can have a similar configuration and movement to the first arm 72A and the first latch tip 80A of the first latch 70A, except for moving in an opposite direction from the first arm 72A. For example, the second arm 72B moves in an opposite direction (e.g., opposite direction to the first direction $D_1$ when being locked). The second latch tip 80B also rotates and extends through an opening in the second side 56B of the door 50.

Figure 6:
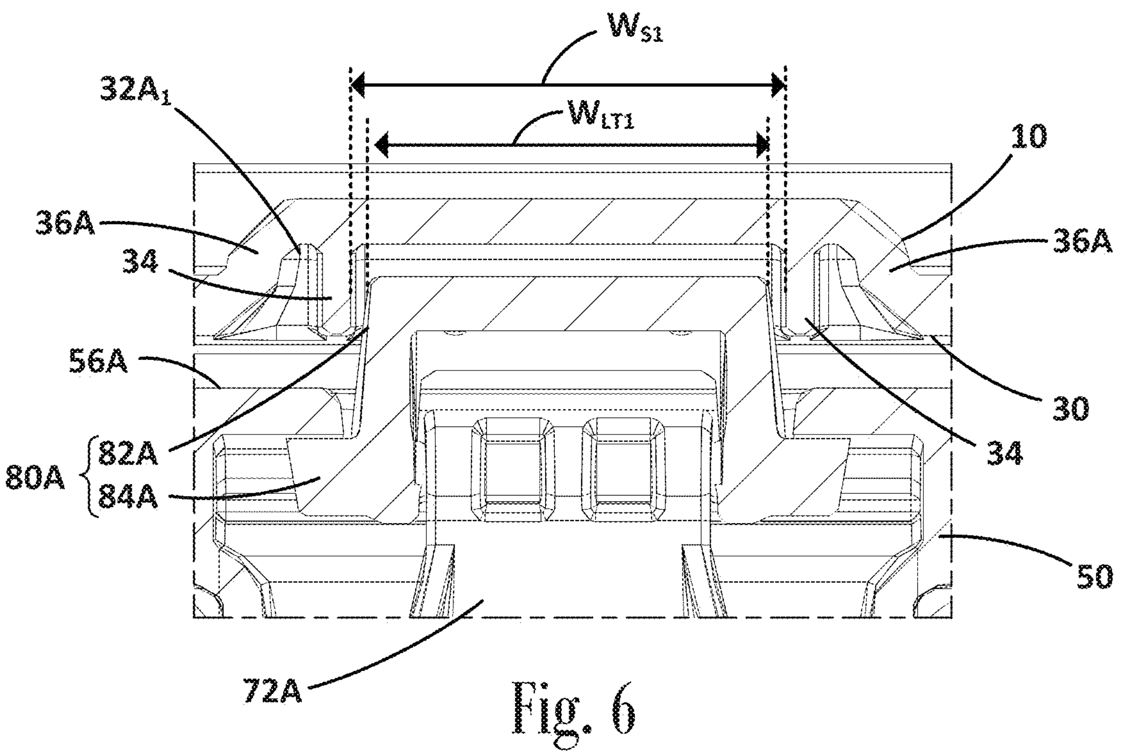
FIG. 6 is an enlarged view of area A in FIG. 4A, according to an embodiment.
Figure 7:
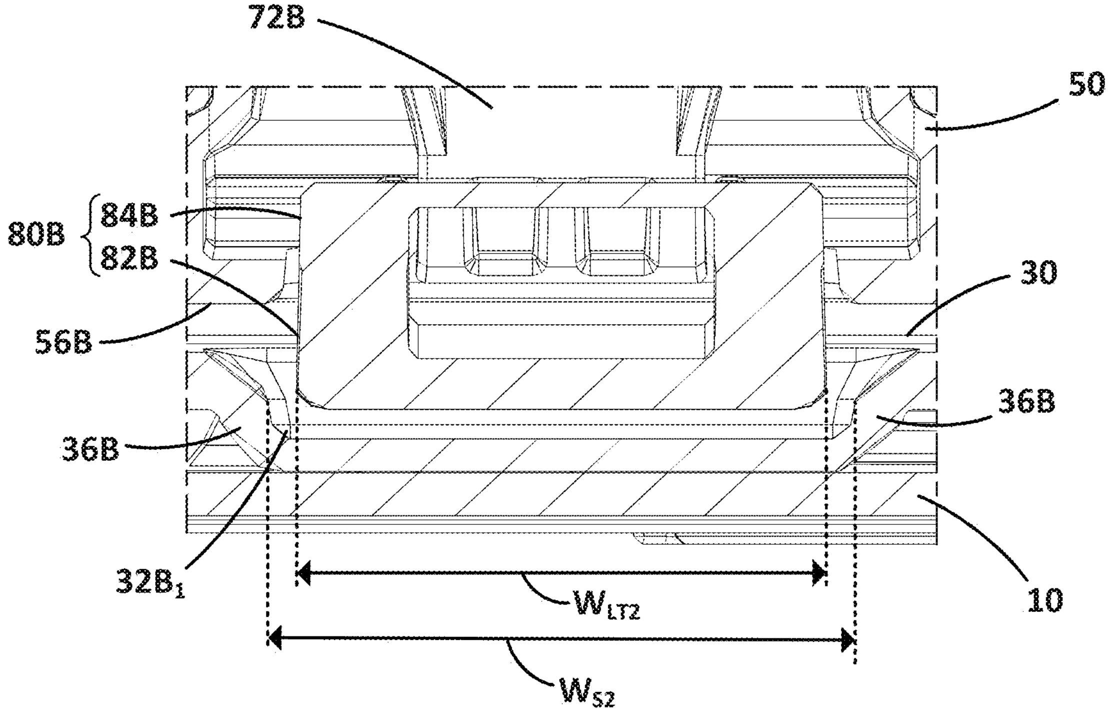
FIG. 7 is an enlarge view of area B in FIG. 4B, according to an embodiment.

FIG. 6 is an enlarged view of area A in FIG. 4A, according to an embodiment. FIG. 7 is an enlarged view of the area B in FIG. 4A. FIG. 6 shows an enlarged view of the engagement between the first latch 70A of the door 50 and the first latch socket 32$A_1$ of the shell 10. FIG. 7 shows an enlarged view of the engagement between the second latch 70B of the door 50 and the second latch socket 32$B_1$ of the shell 10. FIG. 7 shows an enlarged view of the engagement between the second latch 70B of the door 50 and the first latch socket 32$A_1$ of the shell 10.

As shown in FIG. 7, the second latch socket 32$B_1$ of the shell 10 has a width $W_{S2}$. As shown in FIG. 6, the first latch socket 32$A_1$ of the shell 10 has a width $W_{S1}$. The width $W_{S1}$ of the first latch socket 32$A_1$ is shorter than the width $W_{S2}$ of the second latch socket 32$B_1$. As shown in FIG. 6, the door frame 30 includes a pair of ribs 34 disposed in the first latch socket 32$A_1$. The width $W_{S1}$ of the first latch socket 32$A_1$ is defined by the ribs 34. In another embodiment, the first latch socket 32$A_1$ may contain a single rib 34 that defines the width $W_{S1}$ of the first latch socket 32$A_1$. In another embodiment, the latch socket 32$A_1$ may be formed to have the width $W_{S1}$ without any ribs 34. For example, the width $W_{S1}$ of the first latch socket 32$A_1$ can be defined by the endwalls 36A that form and define the latch socket 32$A_1$ (e.g., the width $W_{S1}$ can be the entire width of the first latch socket 32$A_1$ as formed in the door frame 30). For example, width of each latch socket extends in a length direction of the door frame 30 (e.g., in a direction perpendicular to the insertion direction of the door 5, parallel to the perimeter of the opening 12).

As shown in FIG. 7, the width $W_{S2}$ of the second latch socket 32$B_1$ is longer than the width $W_{S1}$ of the first latch socket 32$A_1$. The width $W_{S2}$ of the second latch socket 32$B_1$ is be defined by the endwalls 36B that form and define the latch socket 32$A_1$ (e.g., the width $W_{S2}$ is the entire width of the second latch socket 32$B_1$ as formed in the door frame 30). In another embodiment, the door frame 30 may include one or more ribs to form the relatively longer width $W_{S2}$ of the second latch socket 32.

The first latch tip 80A has a width $W_{LT1}$. The width $W_{LT1}$ of the first latch tip 80A is insertable into the first latch socket 32$A_1$. The width $W_{LT1}$ of the first latch tip 80A is also insertable into the second latch socket 32$B_1$. For example, the width $W_{LT1}$ of the first latch tip 80A is equal to or shorter than both the width $W_{S1}$ of the first latch socket 32$A_1$ and the width $W_{LT1}$ of the second latch socket 32$B_1$. The end of the first latch tip 80A also has a shape that allows the first latch tip 80A to be insertable into both the first latch socket 32$A_1$ and the second latch socket 32$B_1$. For example, the width $W_{LT1}$ of the first latch tip 80A is a width of the engagement member 82A of the first latch tip 32$A_1$. The width $W_{LT1}$ can be a width of the endmost surface 88A of the first latch tip 80A (e.g., the width $W_{LT1}$ is of an endmost surface 88A of the engagement member 82A of the first latch tip 80A).

The second latch tip 80B has a width $W_{LT2}$. The width $W_{LT2}$ of the second latch tip 80B is insertable into the second latch socket 32$B_1$. The width $W_{LT2}$ of the second latch tip 80B blocks the second latch tip 80B from being insertable into the second latch socket 32$B_1$. For example, the width $W_{LT2}$ of the second latch tip 80B is equal to or shorter than both the width $W_{S2}$ of the second latch socket 32$B_1$ and is greater than the width $W_{LT2}$ of the second latch socket 32$B_1$. For example, the width $W_{LT2}$ of the second latch tip 80B is a width of the engagement member 82B of the second latch tip 80B. The width $W_{LT2}$ can be a width of the endmost surface 88B of the second latch tip 80B (e.g., the width $W_{LT2}$ of an endmost surface 88B of the engagement member 82B of the second latch tip 80B).

The latch tips 80C, 80D and in the second locking mechanism 60B can have a similar configuration as described above for the latch tips 80A, 80B of the first locking mechanism 60A. The first slot 32$A_2$ and second latch socket 32$B_2$ engaged by latch tips 80C, 80D of the second locking mechanism 60B can have a similar configuration as described above for the first slot $32_{A1}$ and the second latch socket $32_{B1}$ engaged by the latch tips 80A, 80B of the first locking mechanism 60A. For example, the third latch tip 80C can have a width (e.g., have width $W_{LT1}$) that is shorter than a width of the fourth latch tip 80C (e.g., have width $W_{LT2}$), as shown in FIGS. 4A and 4B. For example, the first latch socket $32_{A2}$ can have a width (e.g., have width $W_{S1}$) that is shorter than a width of the of the second latch socket 32B2 (e.g., have width $W_{S2}$), as shown in FIG. 4A. In an embodiment, the shell 10 may include one or two ribs (e.g., similar to rib 34) disposed in the first latch socket $32_{A2}$ that define the width of the first latch socket $32_{A2}$.

Figure 8:
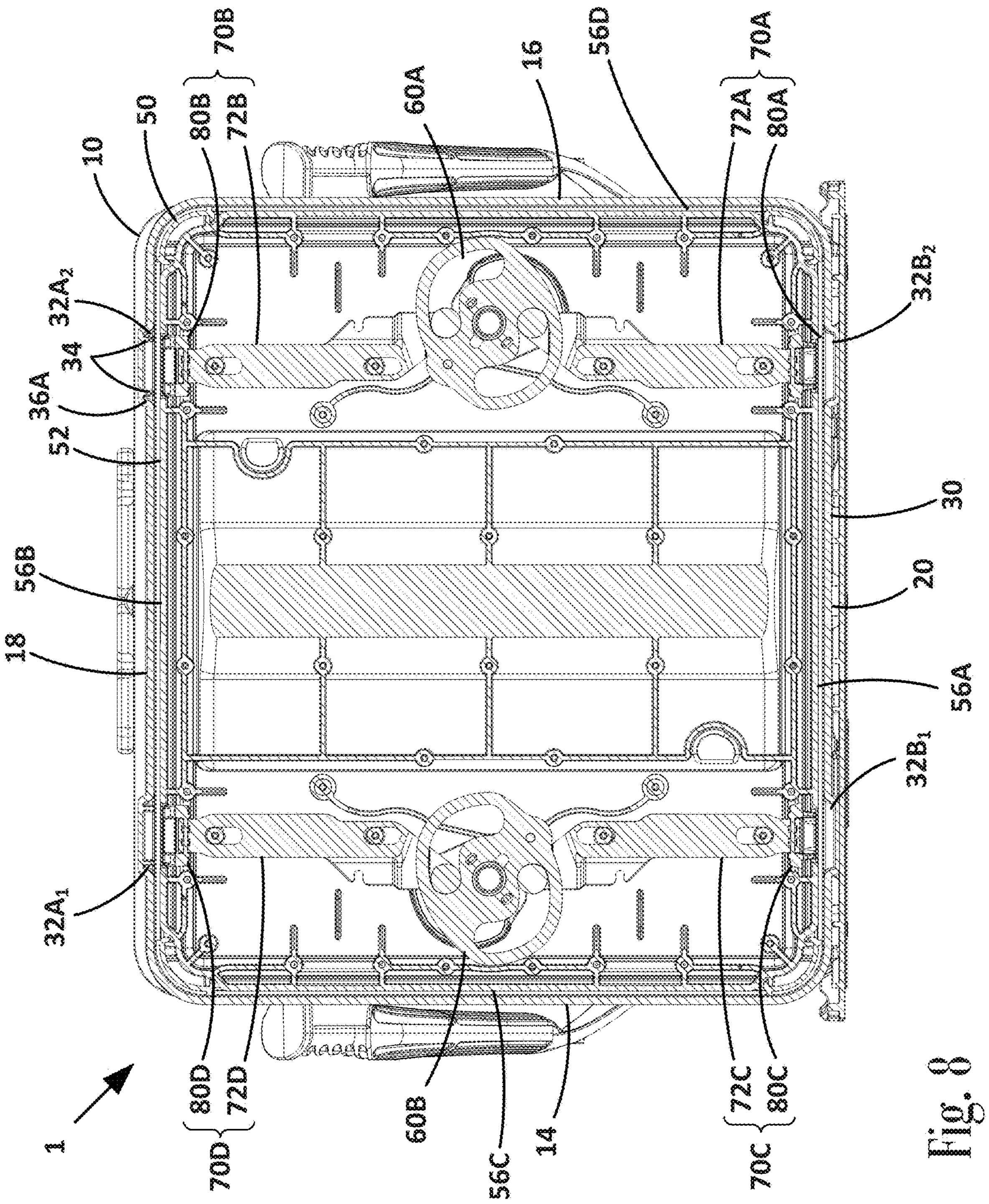
FIG. 8 is the cross-sectional view of the substrate container in FIG. 4B with a door in a rotated orientation, according to an embodiment.

FIGS. 4A and 4B show the door 50 inserted into the door frame 30 in a first orientation. The door 50 is configured to be insertable into the door frame 30 in the first orientation and in a second orientation. FIG. 8 is a cross-sectional view of the substrate container 1 with the door 50 inserted in the second orientation, according to an embodiment. The cross-sectional view in FIG. 8 is the same as in FIG. 4B, except for the orientation of the door 50. For example, the door 50 may have the same positon within the door frame 30 in the first orientation and in the second orientation (e.g., the door 50 is seated in the door frame 30 in a same manner in both the first orientation and the second orientation).

In FIG. 8, the door 50 is inverted (e.g., upside down) in the second orientation relative to the first orientation. The door 50 in the second orientation is rotated by 180 degrees relative to the door 50 in the second orientation of the door 50. For example, in the second position, the first side 56A of the door 50 faces downwards (e.g., faces the bottom wall 20 of the shell 10) and the second side 56B of the door 50 faces upwards (e.g., faces the top side 18 of the shell 10).

As shown in FIG. 8, in the second orientation, the first latch tip 80A can be aligned with second latch socket 32$B_2$, and the second latch tip 80B is aligned with first latch socket 32$A_2$. In the illustrated embodiment, the first latch tip 80A is aligned with the second one of second latch sockets 32$B_2$ and the second latch tip 80B is aligned with the second one of the first latch sockets 32$A_2$. For the second locking mechanism 60B, the third latch tip 80C is aligned with the first one of the second latch sockets 32$B_1$ and the fourth latch tip 80C is aligned with the first one of the first latch sockets 32$A_1$.

FIG. 8 shows the first locking mechanism 60A in the unlocked position. The second latch tip 80B is configured to prevent the first locking mechanism 60A from being moved into the locked position. When the first locking mechanism 60A is moved from the unlocked position, the second latch tip 80B is blocked from entering the first latch socket 32$A_2$. The width of the first latch socket 32$A_2$ (e.g., width $W_{S2}$) blocks insertion of the second latch tip 80B into the first latch socket 32$A_2$. In the illustrated embodiment, the second latch tip 80B is blocked from being inserted into the first latch socket 32$A_2$ by the ribs in the first latch socket 32$A_2$ (e.g., ribs 34). In an embodiment, the second latch tip 80B can be blocked from being inserted into the first latch socket 32$A_2$ by at least one of a rib (e.g., rib 34) and an endwall 36A of the first latch socket 32$A_2$. The blocking of the insertion of the second latch tip 80B into the first latch socket 32$A_2$ prevents the locking of the first locking mechanism 60A (e.g., prevents the first locking mechanism 60A from being moved into the locked position, blocks the first locking mechanism 60A from achieving the locked positon) when the door 50 is in the second orientation.

As shown in FIG. 8, the width $W_{LT1}$ of the first latch tip 80A is insertable into the second latch socket 32$B_2$. The first latch tip 80A is also aligned with the second latch socket 32$B_2$ in the second orientation. The blocking of the insertion of the second latch tip 80B into the first latch socket 32$A2_1$ restricts the first latch tip 80A from being inserted into the second latch socket 32$B_2$. For example, the first latch 70A and the second latch 70B are both actuated by the rotatable cam 62A. The blocked insertion/movement of the second latch tip 80B into the first latch socket 32$A_2$ prevents further rotation of the rotatable cam 62A which restricts further rotation/extension of the first latch tip 80A towards/into the second latch socket 32$B_2$.

As discussed above, the door 50 in an embodiment may include a single locking mechanism 60A. In such an embodiment, the rotation of the door 50 between the first and second orientations may rotate a first locking mechanism 60A without moving its general positon within the door 50. In such an embodiment, in the second orientation, the first latch tip 80A can align with the second latch socket 32$B_1$ and the second latch tip 80B can align with the first latch socket 32$A_1$. The width $WS_1$ of the first latch socket 32$A_1$ blocks the insertion of the second latch tip 80B into the first latch socket 32$A_1$.

Figure 9:
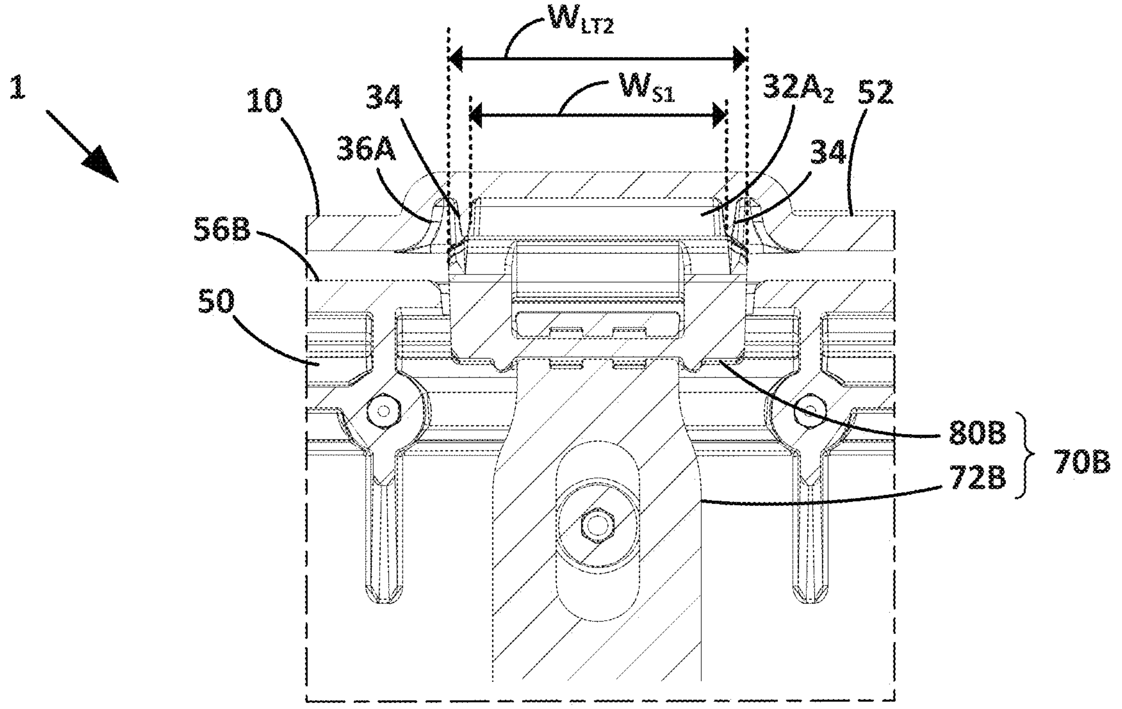
FIG. 9 is a cross-sectional view of a blocked latch tip insertion when attempting to lock the substrate container with the door in the rotated orientation in FIG. 8, according to an embodiment.

FIG. 9 is a partial cross-sectional view of the second latch tip 80B in the inverted inserted door 50 being blocked from being inserted into the shell 10, according to an embodiment. In FIG. 9, the locking mechanism 60A is in an intermediate position between the unlocked position and the locked position. For example, the intermediate positon occurs when the locking mechanism 60A is being moved from the unlocked position to the locked position.

As shown in FIG. 9, the second latch tip 80B contacts the ribs 34 which blocks the second latch tip 80B from being inserted into the first latch socket 32$A_2$. The relatively larger width $W_{LT2}$ of the second latch tip 80B prevents the second latch tip 80B from being inserted into the first latch slot 32$A_2$. As shown in FIG. 9, the blocking of the second latch tip 80B refers to blocking of the second latch tip 80B from being significantly inserted into the first latch socket 32$A_2$. For example, the end of the second latch tip 80B may still be minimally inserted into the first latch socket 32$A_2$. The second latch tip 80B is blocked from being inserted into the first latch socket 32$A_2$ to a degree (e.g., depth) that the second latch tip 80B does not engage with the first latch socket 32$A_2$. In an embodiment, the at least one rib 34 and/or endwall 36A of the first latch slot 32$A_2$ may be formed (e.g., sized) to prevent any insertion of the second latch tip 80B into the first latch slot 32$A_2$.

In the intermediate position of the locking mechanism 60A, the first latch tip 80A is not blocked from being inserted into the second latch socket 32$B_2$. In the intermediate position, nothing in the second socket slot 32$B_2$ blocks the first latch tip 80A from being inserted (e.g., the first latch tip 80A is not contacting a rib and is not contacting an endwall of second socket 32$B_2$ that would block insertion of the first latch tip 80A). For example, the first latch tip 80A in the intermediate position may be partially inserted as similarly discussed with the second latch tip 80B. The contact of the second latch tip 80B prevents further movement of the locking mechanism 60A towards the locked position (e.g., further rotation of the rotatable cam 62), such that the locking mechanism 60A is preventing from reaching the locked positon. This prevents insertion and engagement of the first latch tip 80A with the second latch slot 32$B_2$.

Figure 10:
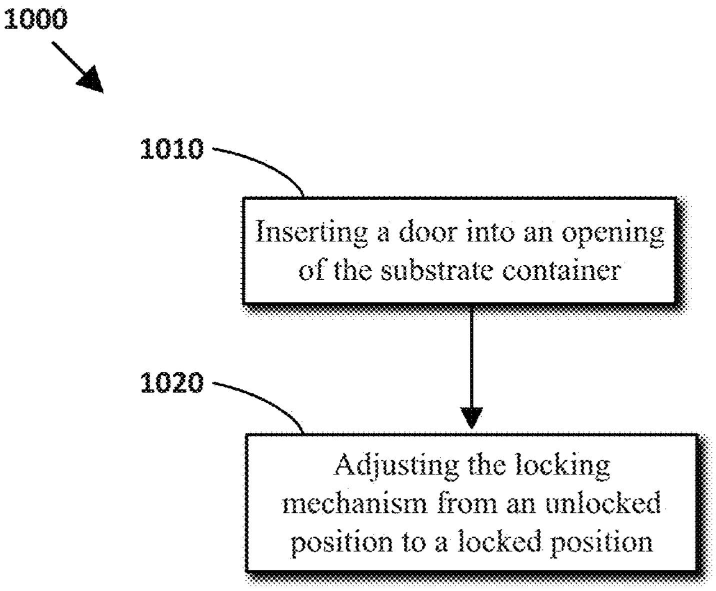
FIG. 10 is a block flow diagram of an embodiment of a method of closing a substrate container.

FIG. 10 is a block for diagram of a method 1000 of closing a substrate container. For example, method 1000 may be used to close the open substrate container 1 in FIG. 2. The substrate container includes a shell (e.g., shell 10) and a door (e.g., door 50), and the door includes a first locking mechanism (e.g., first locking mechanism 60). The method 1000 starts at 1010.

At 1010, the door is inserted into an opening (e.g., opening 12) of the substrate container. The shell includes a door frame (e.g., door frame 30) that defines the opening. The door frame includes one or more first latch sockets (e.g., first latch socket 32$A_1$, first latch socket 32$A_2$) and one or more second latch sockets (e.g., second latch socket 32$B_1$, second latch socket 32$B_2$). The method 1000 then proceeds to 1020.

At 1020, the first locking mechanism is adjusted from an unlocked position to a locked position. For example, the adjusting at 1020 includes moving the first locking mechanism from the unlocked position towards the locked positon. The first locking mechanism includes a first latch (e.g., first latch 70A) and a second latch (e.g., second latch 80A). The adjusting of the locking mechanism at 1020 includes rotating a first latch tip (e.g., first latch tip 80A) of the first latch to extend through a first side (e.g., first side 56A) of the door. The adjusting of the locking mechanism at 1020 includes rotating a second latch tip of the second latch to extend through a second side (e.g., second side 56B) of the door.

For a first orientation of the door in the opening (e.g., orientation of the door 50 as shown in FIG. 4B), the adjusting of the locking mechanism at 1020 is configured to insert the first latch tip into the one or more first latch sockets (e.g., into first latch socket 32$A_1$, into first latch socket 32$A_2$) and insert the second latch tip into the second latch socket (e.g., into second latch socket 32$B_1$, into second latch socket $32B_2$). For example, this results in the locking mechanism achieving the locked position.

For a second orientation of the door in the opening, the adjusting of the locking mechanism at 1020 is configured to have a width (e.g., width $W_{S1}$) of the one or more first latch sockets (e.g., of first latch socket $32A_1$, of first latch socket $32A_2$) block insertion of the second latch tip into the one or more first latch sockets. For example, the blocking of the insertion of the second latch into the first latch socket blocks (e.g., prevents) the locking mechanism from achieving the locked position.

It should be appreciated that the method 1000 in an embodiment may be modified to include features as shown and/or discussed for the substrate container in FIGS. 1-9. For example, the adjusting of the locking mechanism at 1010 may include rotating of a rotatable cam (e.g., first rotatable cam 62A) of the first locking mechanism.

Aspects:

Any of Aspects 1-12 can be combined with any of aspects 13-20, and any of Aspects 13-18 can be combined with any of Aspects 19 and 20.

Aspect 1. A substrate container comprising: a shell defining an interior space, the shell having an opening defined by a door frame, the door frame including one or more first latch sockets and one or more second latch sockets disposed on opposite sides of the door frame; and a door including a first locking mechanism, the door configured to be inserted in the opening of the shell and attached to the door frame by the first locking mechanism, the first locking mechanism including: a first latch with a first latch tip rotatable to extend through a first side of the door, the first latch tip having a width insertable into both the one or more first latch sockets and the one or more second latch sockets, and a second latch with a second latch tip rotatable to extend through a second side of the door, the second latch tip having a width insertable into the one or more second latch sockets, the one or more first latch sockets having a first width that blocks the second latch tip from being inserted into the one or more first latch sockets.

Aspect 2. The substrate container of Aspect 1, wherein a first one of the one or more first latch sockets has the first width that is shorter than a width of a first one of the one or more second latch sockets.

Aspect 3. The substrate container of Aspect 2, wherein the door frame includes one or more ribs disposed in the first one of the one or more first latch sockets, the first width of the first one of the one or more first latch sockets is defined by the one or more ribs, and the one or more ribs being configured to block insertion of the second latch tip into the first one of the one or more first latch sockets by the second latch tip contacting the one or more ribs.

Aspect 4. The substrate container of any one of Aspects 1-3, wherein the blocking of the insertion of the second latch tip into the one or more first latch sockets restricts the first latch tip from being inserted into the one or more second latch sockets.

Aspect 5. The substrate container of any one of Aspects 1-4, wherein the width of the first latch tip is a width of an end surface of the first latch tip, and the width of the second latch tip is a width of an end surface of the second latch tip.

Aspect 6. The substrate container of any one of Aspects 1-5, wherein the door is configured to be insertable into the door frame in a first orientation and in a second orientation, the door in the second orientation being rotated by 180 degrees relative to the first orientation, and the door configured to be attached to the door frame by the first locking mechanism in the first orientation.

Aspect 7. The substrate container of Aspect 6, wherein in the second orientation, insertion of the second latch tip into a first one of the one or more first latch sockets is blocked by the second latch tip contacting at least one of a rib and an endwall of the first one of the one or more first latch sockets.

Aspect 8. The substrate container of any one of Aspects 1-7, wherein the width of the first latch tip of the first locking mechanism is insertable into both a first one of the one or more first latch sockets and a first one of the one or more second latch sockets, the width of the second latch tip of the first locking mechanism is insertable into a first one of the one or more second latch sockets, the door includes a second locking mechanism having: a third latch with a third latch tip rotatable to extend through the first side of the door, the third latch tip having a width insertable into both a second one of the one or more first latch sockets and a second one of the one or more second latch sockets, and a fourth latch with a fourth latch tip rotatable to extend through the second side of the door, the fourth latch tip having a width insertable into the second one of the one or more second latch sockets, the first width is a width of the second one of the first latch sockets, and a second width of the first one of first latch sockets blocks the fourth latch tip from being inserted into the first one of the first latch sockets.

Aspect 9. The substrate container of any one of Aspects 1-8, wherein the first latch tip includes an engagement member and a pivot member that extend in different directions, the engagement member having the width of the first latch tip, and rotation of the first latch tip moves the engagement member to extend through an opening in the first side of the door.

Aspect 10. The substrate container of Aspect 9, wherein the pivot member being configured to be pushed against an inner surface of the door causing the rotation of the first latch tip.

Aspect 11. The substrate container of any one of Aspects 1-10, wherein the locking mechanism includes a rotatable cam, the first latch includes a first arm coupling the rotatable cam to the first latch tip, and the second latch includes a second arm coupling the rotatable cam to the second latch tip, such that rotation of the rotatable cam causes rotation of each of the first latch tip and the second latch tip.

Aspect 12. The substrate container of any one of Aspects 1-11, wherein the substrate container is a front opening unified pod.

Aspect 13. A door for a substrate container, the door comprising: a door housing including a first side and a second side; and a locking mechanism disposed in the door housing and configured to attach the door in an opening of a shell of the substrate container via one or more first latch sockets and one or more second latch sockets disposed on opposite sides of a door frame of the shell, the first locking mechanism including: a first latch with a first latch tip configured to rotate to extend through the first side of the door housing, the first latch tip having a width configured to be inserted into the one or more first latch openings, and a second latch with a second latch tip configured to rotate to extend through the second side of the door housing, the second latch tip having a width insertable into the one or more second latch sockets, a first one of the one or more first latch sockets having a width that blocks the second latch tip from being inserted into the one or more first latch sockets.

Aspect 14. The door of Aspect 13, wherein the door is configured to be insertable into the door frame in a first orientation and in a second orientation, the door in the first orientation being rotated by 180 degrees relative to the second orientation, and the locking mechanism configured to attach the door in the first orientation to the door frame.

Aspect 15. The door of Aspect 14, wherein in the second orientation, the locking mechanism is configured to have insertion of the second latch tip into the first one of the one or more first latch sockets blocked by the second latch tip contacting at least one of a rib and an endwall of the first one of the first latch socket.

Aspect 16. The door of any one of Aspects 13-15, wherein the width of the first latch tip is a width of an end surface of the first latch tip, and the width of the second latch tip is a width of an end surface of the second latch tip.

Aspect 17. The door of any one of Aspects 13-16, wherein the first latch tip includes an engagement member and a pivot member that extend in different directions, the engagement member having the width of the first latch tip, and rotation of the first latch tip moves the engagement member to extend through an opening in the first side of the door, and the pivot member being configured to be pushed against an inner surface of the door causing the rotation of the first latch tip.

Aspect 18. The door of any one of Aspects 13-17, wherein the locking mechanism includes a rotatable cam, the first latch includes a first arm coupling the rotatable cam to the first latch tip, and the second latch includes a second arm coupling the rotatable cam to the second latch tip, such that rotation of the rotatable cam causes rotation of each of the first latch tip and the second latch tip.

Aspect 19. A method of closing a substrate container, the method comprising: inserting a door into an opening of the substrate container, the substrate container including a shell defining an interior space, the shell having the opening defined by a door frame that includes one or more first latch sockets and one or more second latch sockets, the door including a first locking mechanism including a first latch and a second latch; and adjusting the first locking mechanism from an unlocked position to a locked position, which includes rotating a first latch tip of the first latch to extend through a first side of the door and rotating a second latch tip of the second latch to extend through a second side of the door, wherein the adjusting of the first locking mechanism is configured to: in a first orientation of the door in the opening, insert the first latch tip into the one or more first latch sockets and insert the second latch tip into the one or more second latch sockets, and in a second orientation of the door in the opening, have a first width of the one or more first latch sockets block the second latch tip from being inserted into the one or more first latch sockets, which blocks the first locking mechanism from achieving the locked position.

Aspect 20. The method of Aspect 19, wherein the first latch tip has a width insertable into both the one or more first latch sockets and the one or more second latch sockets, and the second latch tip has a width insertable into the one or more second latch sockets and not insertable into the one or more first latch sockets.

The terminology used herein is intended to describe particular embodiments and is not intended to be limiting. The terms "a," "an," and "the" include the plural forms as well, unless clearly indicated otherwise. The terms "comprises" and/or "comprising," when used in this Specification, specify the presence of the stated features, integers, steps, operations, elements, and/or components, but do not preclude the presence or addition of one or more other features, integers, steps, operations, elements, and/or components. In an embodiment, "couples", "coupled", "coupling" as described herein can refer to being "directly couples", "directly connected", and "directly connecting".

With regard to the preceding description, it is to be understood that changes may be made in detail, especially in matters of the construction materials employed and the shape, size, and arrangement of parts without departing from the scope of the present disclosure. This Specification and the embodiments described are exemplary only, with the true scope and spirit of the disclosure being indicated by the claims that follow.

What is claimed is:

1. A substrate container comprising:

a shell defining an interior space, the shell having an opening defined by a door frame, the door frame including one or more first latch sockets and one or more second latch sockets disposed on opposite sides of the door frame; and a door including a first locking mechanism, the door configured to be inserted in the opening of the shell and attached to the door frame by the first locking mechanism, the first locking mechanism including:

a first latch with a first latch tip rotatable to extend through a first side of the door, the first latch tip having a width insertable into both the one or more first latch sockets and the one or more second latch sockets, and a second latch with a second latch tip rotatable to extend through a second side of the door, the second latch tip having a width insertable into the one or more second latch sockets, the one or more first latch sockets having a first width that blocks the second latch tip from being inserted into the one or more first latch sockets, wherein blocking of the second latch tip from being inserted into the one or more first latch sockets prevents further movement of the first locking mechanism toward a locked position.

2. The substrate container of claim 1, wherein a first one of the one or more first latch sockets has the first width that is shorter than a width of a first one of the one or more second latch sockets.

3. The substrate container of claim 2, wherein the door frame includes one or more ribs disposed in the first one of the one or more first latch sockets, the first width of the first one of the one or more first latch sockets is defined by the one or more ribs, and the one or more ribs being configured to block insertion of the second latch tip into the first one of the one or more first latch sockets by the second latch tip contacting the one or more ribs.

4. The substrate container of claim 1, wherein the blocking of the insertion of the second latch tip into the one or more first latch sockets restricts the first latch tip from being inserted into the one or more second latch sockets.

5. The substrate container of claim 1, wherein the width of the first latch tip is a width of an end surface of the first latch tip, and the width of the second latch tip is a width of an end surface of the second latch tip.

6. The substrate container of claim 1, wherein the door is configured to be insertable into the door frame in a first orientation and in a second orientation, the door in the second orientation being rotated by 180 degrees relative to the first orientation, and the door configured to be attached to the door frame by the first locking mechanism in the first orientation.

7. The substrate container of claim 6, wherein in the second orientation, insertion of the second latch tip into a first one of the one or more first latch sockets is blocked by the second latch tip contacting at least one of a rib and an endwall of the first one of the one or more first latch sockets.

8. The substrate container of claim 1, wherein the width of the first latch tip of the first locking mechanism is insertable into both a first one of the one or more first latch sockets and a first one of the one or more second latch sockets, the width of the second latch tip of the first locking mechanism is insertable into a first one of the one or more second latch sockets, the door includes a second locking mechanism having:

a third latch with a third latch tip rotatable to extend through the first side of the door, the third latch tip having a width insertable into both a second one of the one or more first latch sockets and a second one of the one or more second latch sockets, and a fourth latch with a fourth latch tip rotatable to extend through the second side of the door, the fourth latch tip having a width insertable into the second one of the one or more second latch sockets, the first width is a width of the second one of the first latch sockets, and a second width of the first one of first latch sockets blocks the fourth latch tip from being inserted into the first one of the first latch sockets.

9. The substrate container of claim 1, wherein the first latch tip includes an engagement member and a pivot member that extend in different directions, the engagement member having the width of the first latch tip, and rotation of the first latch tip moves the engagement member to extend through an opening in the first side of the door.

10. The substrate container of claim 9, wherein the pivot member being configured to be pushed against an inner surface of the door causing the rotation of the first latch tip.

11. The substrate container of claim 1, wherein the locking mechanism includes a rotatable cam, the first latch includes a first arm coupling the rotatable cam to the first latch tip, and the second latch includes a second arm coupling the rotatable cam to the second latch tip, such that rotation of the rotatable cam causes rotation of each of the first latch tip and the second latch tip.

12. The substrate container of claim 1, wherein the substrate container is a front opening unified pod.

13. A door for a substrate container, the door comprising:

a door housing including a first side and a second side; and a locking mechanism disposed in the door housing and configured to attach the door in an opening of a shell of the substrate container via one or more first latch sockets and one or more second latch sockets disposed on opposite sides of a door frame of the shell, the locking mechanism including:

a first latch with a first latch tip configured to rotate to extend through the first side of the door housing, the first latch tip having a width configured to be inserted into the one or more first latch sockets, and a second latch with a second latch tip configured to rotate to extend through the second side of the door housing, the second latch tip having a width insertable into the one or more second latch sockets, a first one of the one or more first latch sockets having a width that blocks the second latch tip from being inserted into the one or more first latch sockets, wherein the locking mechanism includes a rotatable cam coupled to the first latch and the second latch such that rotation of the rotatable cam moves the first latch tip and the second latch tip toward a locked position, and wherein obstruction of movement of the second latch tip prevents further rotation of the rotatable cam, thereby preventing further movement of the first latch tip toward the locked position.

14. The door of claim 13, wherein the door is configured to be insertable into the door frame in a first orientation and in a second orientation, the door in the first orientation being rotated by 180 degrees relative to the second orientation, and the locking mechanism configured to attach the door in the first orientation to the door frame.

15. The door of claim 14, wherein in the second orientation, the locking mechanism is configured to have insertion of the second latch tip into the first one of the one or more first latch sockets blocked by the second latch tip contacting at least one of a rib and an endwall of the first one of the first latch socket.

16. The door of claim 13, wherein the width of the first latch tip is a width of an end surface of the first latch tip, and the width of the second latch tip is a width of an end surface of the second latch tip.

17. The door of claim 13, wherein the first latch tip includes an engagement member and a pivot member that extend in different directions, the engagement member having the width of the first latch tip, and rotation of the first latch tip moves the engagement member to extend through an opening in the first side of the door, and the pivot member being configured to be pushed against an inner surface of the door causing the rotation of the first latch tip.

18. The door of claim 13, wherein the locking mechanism includes a rotatable cam, the first latch includes a first arm coupling the rotatable cam to the first latch tip, and the second latch includes a second arm coupling the rotatable cam to the second latch tip, such that rotation of the rotatable cam causes rotation of each of the first latch tip and the second latch tip.

19. A method of closing a substrate container, the method comprising:

inserting a door into an opening of the substrate container, the substrate container including a shell defining an interior space, the shell having the opening defined by a door frame that includes one or more first latch sockets and one or more second latch sockets, the door including a first locking mechanism including a first latch and a second latch; and adjusting the first locking mechanism from an unlocked position to a locked position, which includes rotating a first latch tip of the first latch to extend through a first side of the door and rotating a second latch tip of the second latch to extend through a second side of the door, wherein the adjusting of the first locking mechanism is configured to:

in a first orientation of the door in the opening, insert the first latch tip into the one or more first latch sockets and insert the second latch tip into the one or more second latch sockets, and in a second orientation of the door in the opening, have a first width of the one or more first latch sockets block the second latch tip from being inserted into the one or more first latch sockets, thereby preventing further movement of the first locking mechanism toward the locked position.

20. The method of claim 19, wherein the first latch tip has a width insertable into both the one or more first latch sockets and the one or more second latch sockets, and the second latch tip has a width insertable into the one or more second latch sockets and not insertable into the one or more first latch sockets.

* * * * *